(12) United States Patent  
Meyer et al.

(10) Patent No.: US 7,697,305 B2
(45) Date of Patent: Apr. 13, 2010

(54) APPARATUS AND METHOD FOR ENHANCING CONDUCTIVITY

(75) Inventors: Gregory S. Meyer, Roseville, CA (US); Karl Conrad, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 340 days.

(21) Appl. No.: 11/741,256

(22) Filed: Apr. 27, 2007

(65) Prior Publication Data

US 2008/0264663 A1    Oct. 30, 2008

(51) Int. Cl.
*H05K 9/00* (2006.01)

(52) U.S. Cl. .................. 361/818; 361/753; 174/254; 174/261; 174/369; 174/394

(58) Field of Classification Search .............. 361/818, 361/753; 174/254, 261, 369, 394
See application file for complete search history.

(56) References Cited

U.S. PATENT DOCUMENTS

| | | | |
|---|---|---|---|
| 4,968,272 A * | 11/1990 | Hanning et al. ............. 439/716 |
| 4,970,625 A | 11/1990 | Belanger et al. | |
| 5,118,904 A | 6/1992 | Nguyenngoc | |
| 5,386,346 A | 1/1995 | Gleadall | |
| 5,463,532 A | 10/1995 | Petitpierre et al. | |
| 5,583,618 A * | 12/1996 | Takeuchi et al. ............. 399/111 |
| 5,800,723 A * | 9/1998 | Juskey et al. ................. 216/16 |
| 5,865,518 A | 2/1999 | Jarrett et al. | |
| 5,975,953 A * | 11/1999 | Peterson ..................... 439/607 |
| 6,058,000 A | 5/2000 | Koenck et al. | |
| 6,135,023 A * | 10/2000 | Sato .......................... 101/120 |
| 6,219,235 B1 | 4/2001 | Diaz et al. | |
| 6,282,389 B1 * | 8/2001 | Matsuzaki et al. .......... 399/111 |
| 6,396,143 B1 * | 5/2002 | Kimbara et al. ............. 257/712 |
| 6,484,364 B2 | 11/2002 | Turner | |
| 6,700,799 B2 * | 3/2004 | Sandoval et al. ............ 361/818 |
| 7,042,211 B2 * | 5/2006 | Kabashima et al. .... 324/207.25 |
| 7,169,460 B1 * | 1/2007 | Chen et al. ................. 428/195.1 |
| 7,301,435 B2 * | 11/2007 | Lussey et al. .................. 338/13 |
| 7,412,767 B2 * | 8/2008 | Kim et al. ...................... 29/879 |
| 2006/0288809 A1 * | 12/2006 | Fleytman ................... 74/89.11 |

* cited by examiner

*Primary Examiner*—Jinhee J Lee
*Assistant Examiner*—Xiaoliang Chen

(57) ABSTRACT

An apparatus is provided comprising a chassis of a sheet of an electrically conductive material having a substantially non-conductive coating. An exposed portion of the chassis can be deformed to provide at least one protrusion such that the non-conductive coating on the at least one protrusion is thinner than a portion of the sheet spaced apart from the at least one protrusion to provide a conductivity path through the sheet.

14 Claims, 4 Drawing Sheets

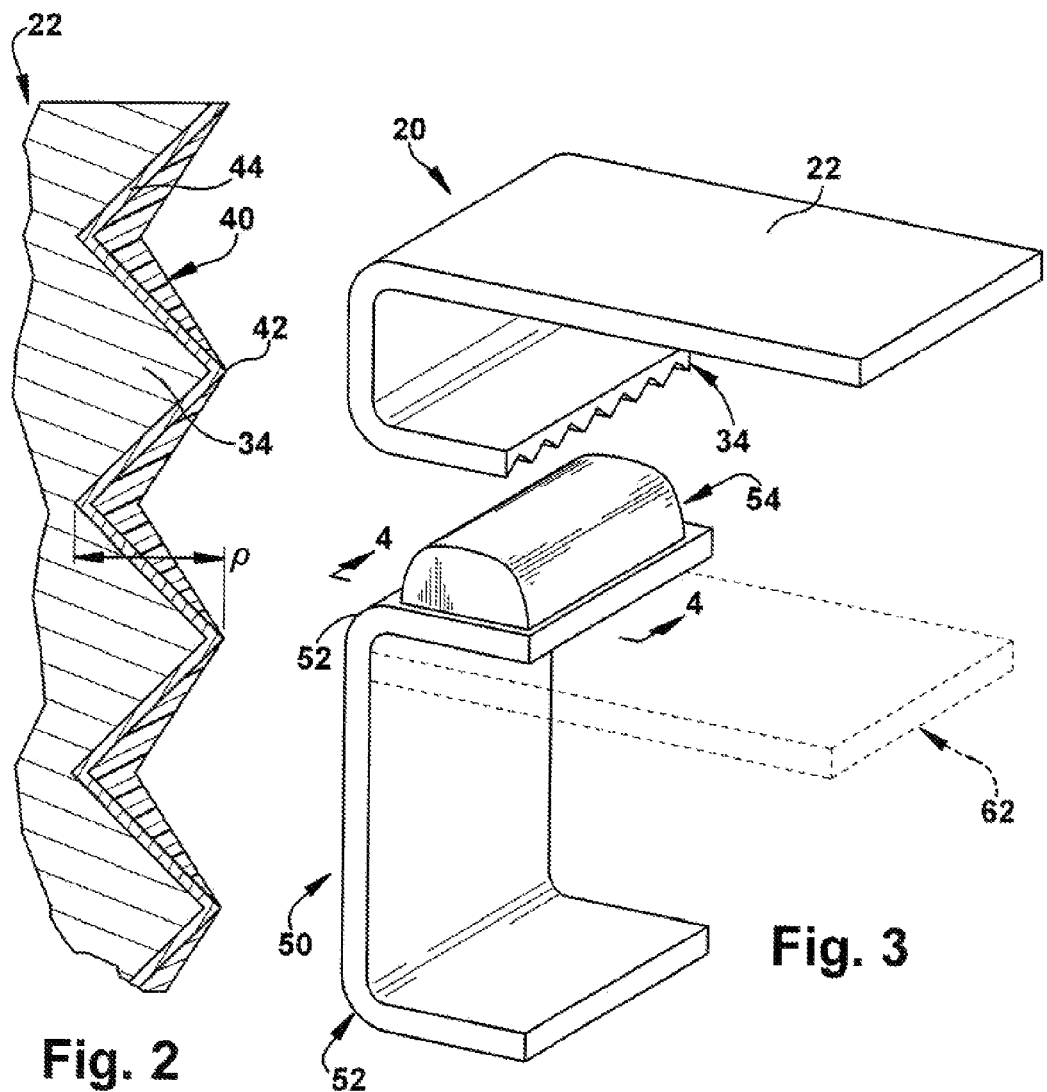
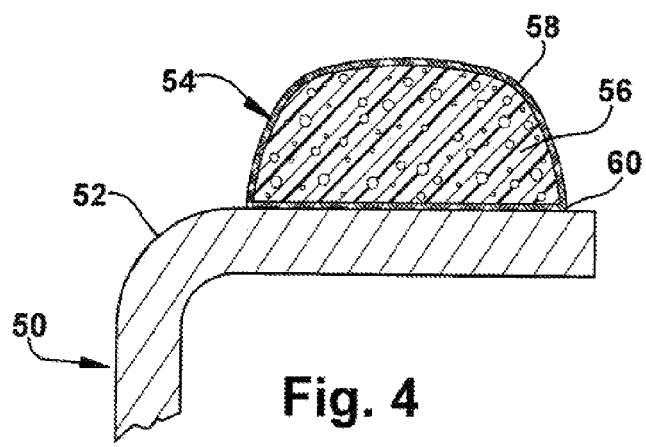

APPARATUS AND METHOD FOR ENHANCING CONDUCTIVITY

BACKGROUND

Sheet metal treatment is well known in the art. Hexavalent chromium ($Cr_6$) is often used as an anti-corrosion layer on top of sheet metal to minimize rust in such goods as electrical housings and computer components. The coating also provides excellent surface protection. However, duet to recent European Union (EU) standards, $Cr_6$ was specifically banned due to its toxicity, and less toxic alternatives such as trivalent chromium ($Cr_3$) have been substituted in its place. However, this compound is not nearly as effective as an anti-corrosion treatment as the prior coating. To compensate for this, the metal industry has added additional proprietary coating layers. Unfortunately, to varying degrees these coatings are not electrically conductive, which has caused the electronics enclosure business (including servers) problems while trying to create an EMI tight Faraday cage around electronics that produce radiated frequencies (RF).

BRIEF DESCRIPTION OF THE DRAWINGS

FIG. 2 is an enlarged sectional view of protrusions formed on the chassis of FIG. 1A, taken along line 2-2.

FIG. 3 is an exploded view of a chassis and a bulkhead in accordance with an embodiment of the invention.

FIG. 4 is an enlarged sectional view of FIG. 3 taken along line 4-4.

DETAILED DESCRIPTION

Figure 1A:
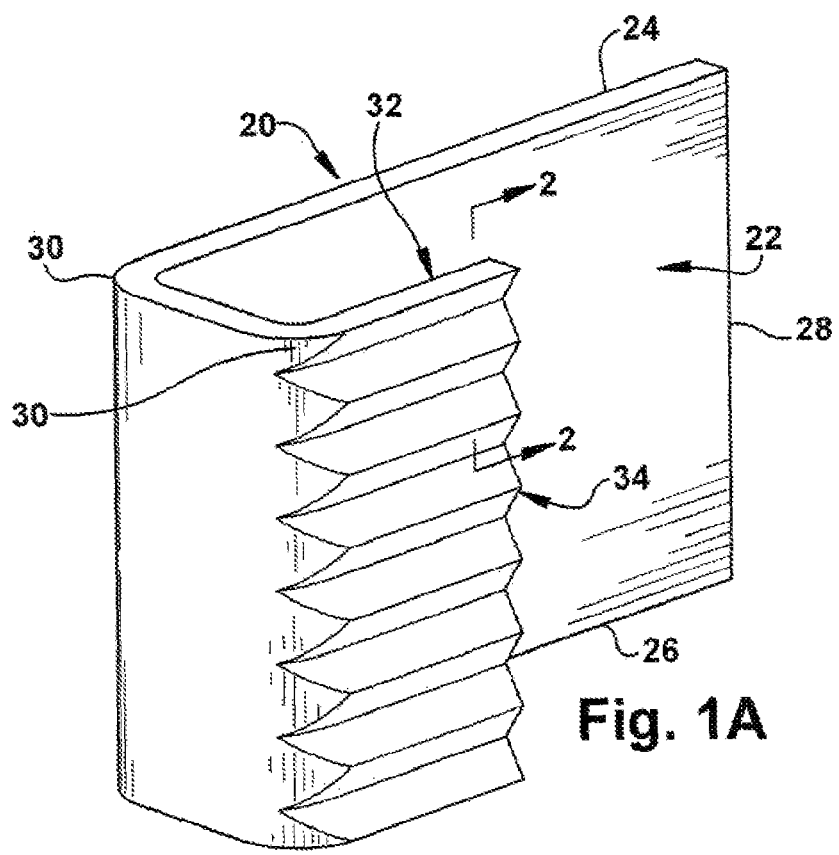
FIG. 1A is an isometric view of a portion of a chassis in accordance with an embodiment of the invention.

An example portion of a chassis 20 is depicted in FIG. 1A. The chassis 20 can be an electrically conductive metal sheet 22, but could be made from any other conductive material. The sheet 22 includes a first edge 24, a second edge 26, and a side portion 28. In the example of FIG. 1, the sheet 22 is substantially rectangular or square in nature and may comprise at least one bend 30, which is made along a substantially 90 degree arcuate angle. The two bends 30 depicted in FIG. 1A create a substantially C-shaped profile in the sheet 22. Although two bends 30 are shown in FIG. 1, it will be understood to those in the art that any number of bends and other shapes and configurations can be utilized, which may vary according to its intended use.

Figure 1B:
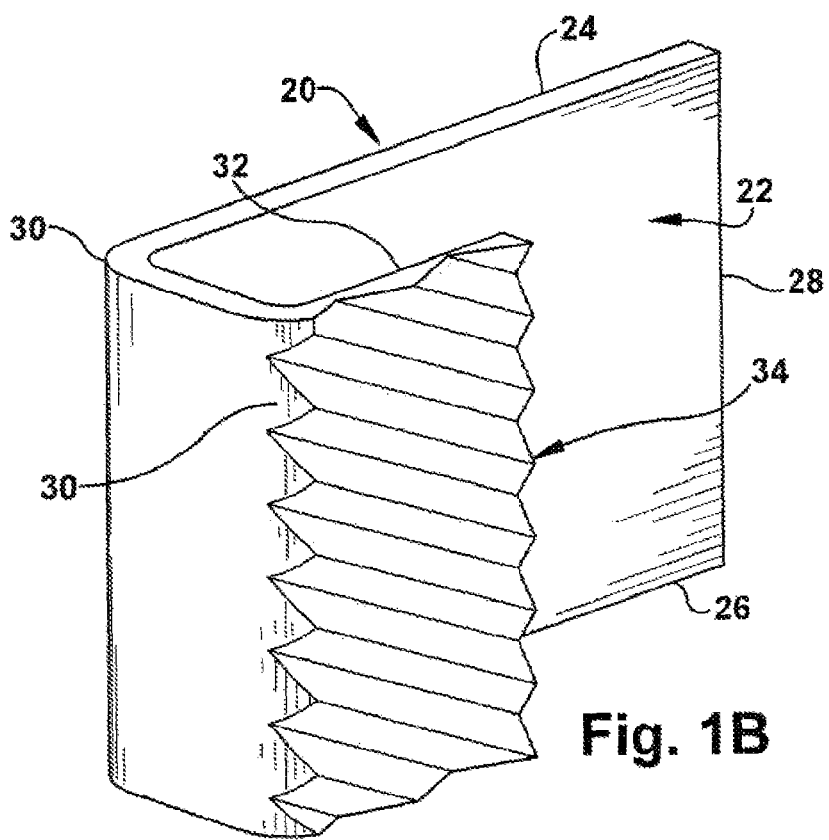
FIG. 1B is an isometric view of a portion of a chassis in accordance with another embodiment of the invention.

A surface of the sheet 22 adjacent at least one end of the sheet 22 includes at least one protrusion 34. The protrusion 34 can be formed by stamping into the surface of the sheet 22. By way of example, a plurality of protrusions 34 can be formed into the sheet 22 using a turret punch (not shown). As shown in FIG. 1A, the protrusions 34 are depicted as a plurality of ribs that extend substantially parallel to the first edge 24 and second edge 26 of the sheet 22. If the sheet 22 includes at least one arcuate bend 30, the protrusions 34 may intersect the curved bend 30. In this way, the plurality of ribs (protrusions 34) laterally extend substantially to and intersect an adjacent edge of the sheet defined by the bend 30. The protrusions 34 can also extend substantially parallel to each other. Alternatively, the protrusions 34 may extend at an angle (e.g., from about 0 to about 45 degrees) relative to the side portion 28, the first edge 24, the second edge 26, or any combination thereof (FIG. 1B). Another alternative approach might be to orient the protrusions to extend substantially parallel to the side portion 38 of the sheet 22.

As shown in the partial sectional view of FIG. 2, the protrusions 34 can be configured to have a pitch, or depth, designated by 'ρ', which is generally uniform. For example, the pitch ρ can be in a range from about 0.25 mm to about 2 mm. Although the protrusions 34 are depicted as having a substantially triangular cross-sectional configuration, those skilled in the art will understand and appreciate various forming techniques may also provide other profiles, such as square, trapezoidal, pyramidal, conical, or the like. Regardless, the nature of the deforming process is such that the protrusions 34 project above corresponding recessed portions of the sheet located between or about the protrusions.

The sheet 22 has disposed thereon a thin, non-electrically conductive coating 40 (FIG. 2). The coating 40 is thin in that is it substantially thinner than a thickness of the sheet 22. The non-electrically conductive coating 40 may be a polymer, and may further act as a surface protector for the sheet 22. Those skilled in the art will appreciate various non-conductive materials that can provide suitable properties for coating the chassis 20. It will further be understood and appreciated by those skilled in the art that the particular thickness of the coating 40 can varying according to the type of material being used as the coating and the intended application of the chassis 20.

The protrusions 34 can be formed into the sheet 22 after the sheet 22 has been coated with the non-conductive coating 40. As a further example, the protrusions 34 can be formed along a flanged edge 32 of the sheet 22 adjacent the at least one bend 30. When the stamping process occurs, the creation of the protrusions 34 causes the coating 40 to become thinner, or possibly removed, across certain portions of the protrusions 34 (FIG. 2). For example, the coating 40 becomes thinner across the tip, or leading edge portion, indicated at 42, of each protrusion 34. That is, the coating 40 is removed in whole or in part from portions 42 of each protrusion 34. As a result, the coating 40 is thinner on the leading edge portion 42 of the protrusions 34 than it is on another portion of the sheet 22 spaced apart from the protrusion 34 (e.g. along the side portion 28 or at the recessed portion between adjacent protrusions). The pitch is such that the coating 40 is sufficiently thinned or stripped, but not so deep that the underlying sheet 22 is structurally impaired. Since the coating 40 is non-conductive, the thinner coating along portions 42 of the protrusions 34 provides a conductivity path to the electrically conductive sheet 22 through these thinly coated edge portions 42.

An additional coating 44 may be provided over the sheet 22. In the example of FIG. 2, the coating 44 is interposed between the sheet 22 and the non-conductive coating 40. This coating 44 can be anti-corrosive in nature and may remain intact (e.g. not thinned) during the forming process. Alternatively, there may be some thinning of the coating 44. The coating 44 may be, for example, trivalent chromium ($Cr_3$). However, those skilled in the art will recognize that coating 44 may be omitted depending on the intended use of the chassis 20.

The chassis 20 is configured to mate with a component module, such as a bulkhead 50, such as shown in FIG. 3.

Similar to the chassis 20, the bulkhead 50 can include a conductive metal sheet 22. In the example of FIG. 3, the bulkhead may include at least one bend 52. The bulkhead 50 as shown in FIG. 3 is generally C-shaped, although alternative shapes of the bulkhead 50 are understood by those skilled in the art, including flat. At least one end of the bulkhead 50 includes a gasket 54 configured to releaseably engage the protrusions 34 on the chassis 20. The bulkhead 50 may include on or more substrate configured to carry various electronics, such as circuit boards or modules indicated schematically by the phantom lines 62 in FIG. 3. The particular types of electronics can vary according to application requirements and manufacturing specifications.

As shown in FIG. 4, the gasket 54 includes a flexible, malleable core, such as Electro-magnetic Interference (EMI) foam 56. The foam core 56 can be covered by a thin electrically conductive layer 58. The conductive layer, for example, can include a fabric having an electrically conductive coating (e.g., nickel-silver-copper). Alternatively, electrically conductive threads can be woven into a fabric that forms the layer 58. The gasket 54 is electrically and physically connected to the end of the bulkhead 50. For instance, a conductive adhesive 60 can be applied as an interface to bind a portion of the conductive layer 58 to the surface of the bulkhead 50. Therefore, the conductive layer 58 and bulkhead 50 are electrically conductively coupled to one another. Although the gasket 54 is depicted in FIG. 4 as having a hemispherical cross-sectional shape (FIG. 4), the gasket 54 may exhibit other cross-sectional shapes, such as rectangular, square, triangular, or the like.

Figure 5:
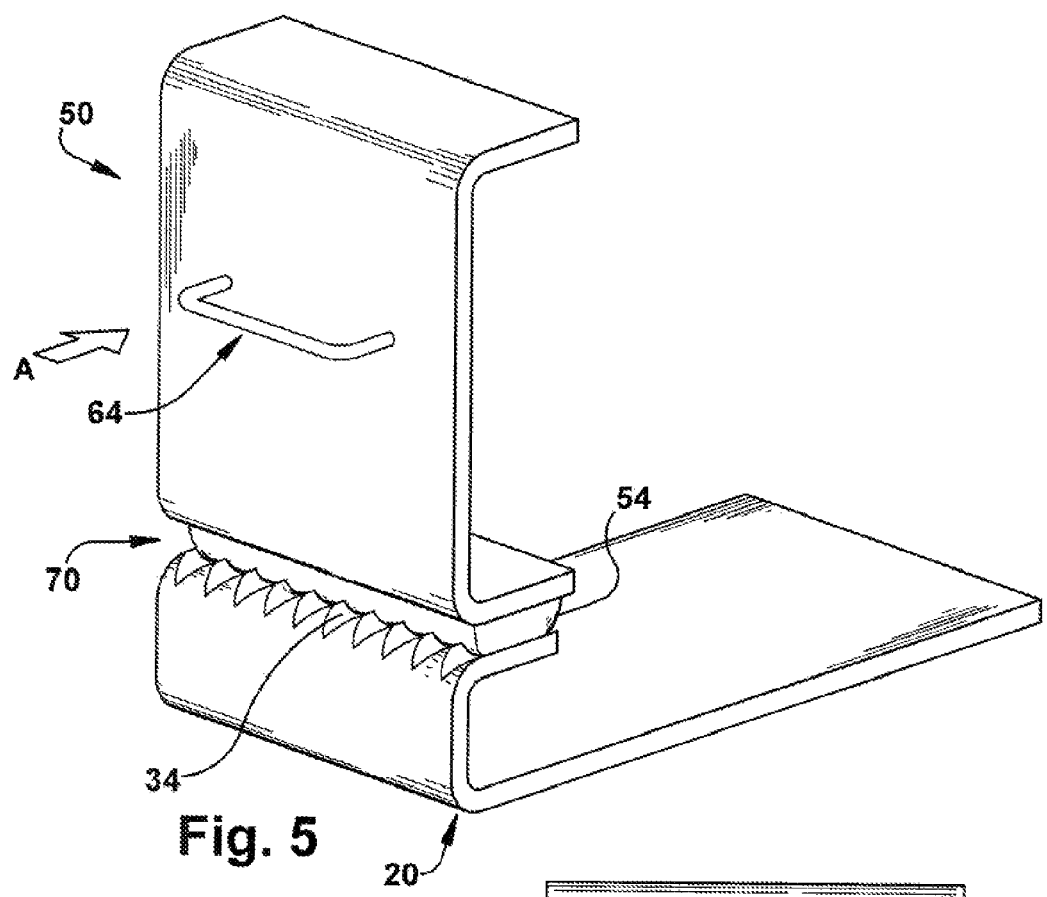
FIG. 5 depict a side view of the chassis and bulkhead of FIG. 3 in an assembled condition.
Figure 6:
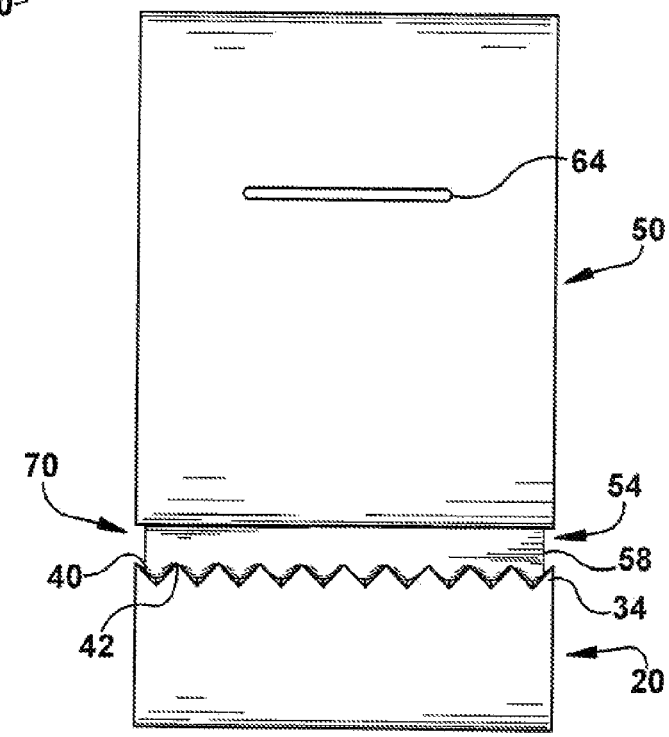
FIG. 6 is a side elevational view of the joint connection of FIG. 5.

To assemble the apparatus, the chassis 20 is held, or otherwise secured, in a fixed position, and the gasket 54 on the bulkhead 50 is aligned with the protrusions 34 on the chassis 20. To bulkhead 50 is then inserted and/or withdrawn in the direction designated as 'A' (FIG. 5) such at that the protrusions 34 on the chassis 20 come into contact with, and releaseably engage, the gasket 54 (FIG. 6). The bulkhead 50 may include a handle 64 to facilitate the insertion of the bulkhead 50. Due to the profile of the protrusions 34, this contact between the protrusions 34 and the gasket 54 may cause the conductive layer 58 (e.g. a fabric material) on the gasket 54 to abrade, but not functionally damage. As shown in FIG. 6, this orientation causes the portions 42 of the protrusions 34 having a thinner coating to contact the conductive layer 58 on the gasket 54. Since these portions 42 of the protrusions 34 have a thinner coating, the coating 40 at these portions does not act as an electrical insulator for the sheet 22, and thus an electrical connection can be made between the leading edge portions 42 of the protrusions 34 (having a thinner coating thereon due to formation of the protrusions) and the conductive layer 58 of the gasket 54. Therefore, robust electrical connection can be made between the chassis 20 and the bulkhead 50.

Figure 7:
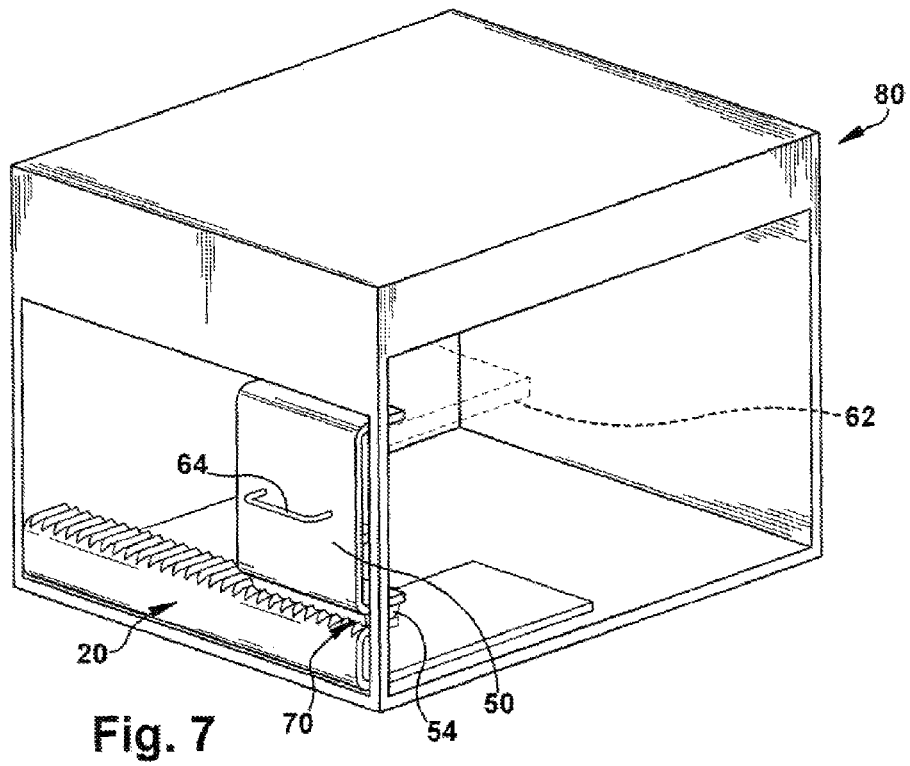
FIG. 7 is a schematic illustration of an embodiment of a computer housing incorporating a joint according to an aspect of the invention.

FIG. 7 depicts an example of a computer housing 80. The housing 80 contains electronics (not shown) that produce radiated frequencies. One or more chassis 20 are installed within the computer housing 80. As indicated in FIG. 5, and described, supra, the bulkhead 50 can be then inserted into engagement with the protrusions 34 on the chassis 20 to create the releasable electrically conductive joint 70 between the two. This orients the optional modules (indicated by phantom lines 62) disposed on the bulkhead 50 within the computer housing 80. Those skilled in the art will understand and appreciate various slots, guides or tracks that can be configured to facilitate insertion and/or removal of the bulkhead 50 relative to the chassis 20. Since the protrusions 34 on the chassis 20 can be oriented in several configurations, it will be understood that, in one embodiment, the protrusions 34 can be oriented such that they extend substantially parallel to the direction that the bulkhead 50 is inserted into the computer housing 80. This orientation facilitates the insertion of the bulkhead 50 into engagement with the protrusions 34. It also facilitates withdrawal of the bulkhead 50 from the computer housing 80 and helps minimize damage to the gasket 54.

When this joint 70 is created, an electrical seal is created between the computer housing 80, the bulkhead 50, and the chassis 20. When the user wishes to access the cards 62 disposed on the bulkhead 50, or otherwise access the computer housing 80, the handle 64 on the bulkhead 50 can be pulled to disengage the bulkhead 50, and thus the gasket 54, from the protrusions 34 on the sheet 22. The flexible and malleable nature of the gasket 54 allows the user to insert and remove the bulkhead 50 multiple times without damaging the gasket 54 or the protrusions 34. Thus, the chassis 20 and bulkhead 50 can cooperate to provide a reliable, reusable, joint 70 having an electrically conductive path between structures. That is, the electrically conductive path is provided between the chassis 20 and the bulkhead 50 through the protrusions 34 and the gasket 54, despite the non-electrically conducive coatings 40. As a result, the joint 70 together with the chassis 20 and bulkhead 50 can form at least a portion of a Faraday cage for the housing 80.

Figure 8:
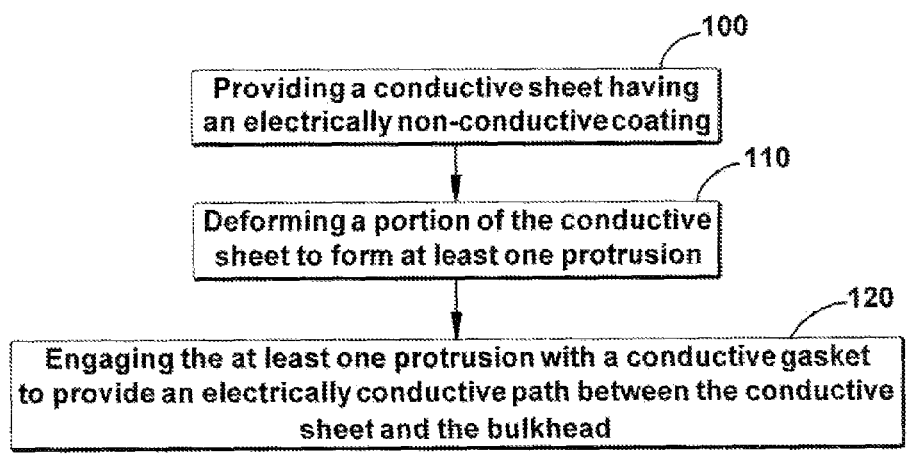
FIG. 8 is a flow diagram illustrating an embodiment of a method of making a joint.

An example method of forming a releasable conductive joint, such as the joint 70 described herein, is depicted in the flow chart of FIG. 8. The method includes providing a conductive sheet having an electrically non-conductive coating disposed thereon, indicated at 100. The method further comprises sufficiently deforming a portion of the sheet to form at least one protrusion, such the coating is thinner on the at least one protrusion than a portion of the sheet spaced apart from the at least one protrusion, indicated at 110. The method further comprises engaging the at least one protrusion with a conductive gasket. The gasket is disposed on a bulkhead such that engagement of the at least one protrusion with the gasket conductively couples the sheet and the bulkhead, indicated at 120.

What has been described above includes examples depicting how the present invention might be implemented. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An apparatus comprising:
    a chassis of a sheet of an electrically conductive material having a substantially non-conductive coating, an exposed portion of the chassis having been deformed to provide at least one protrusion such that the non-conductive coating on the at least one protrusion is thinner than a portion of the sheet spaced apart from the at least one protrusion to provide a conductivity path through the sheet; and
    a gasket that engages the at least one protrusion to form an electrically conductive joint, wherein a computer housing comprises the apparatus, the housing further comprising at least one bulkhead dimensioned and configured for insertion into the housing adjacent the at least one protrusion, the gasket being affixed to the bulkhead, such that upon insertion of the bulkhead into the housing, an electrically conductive path is provided between the chassis and the bulkhead through the at least one protrusion and the gasket, thereby forming at least a portion of a Faraday cage.

2. The apparatus of claim 1, wherein the at least one protrusion comprises a plurality of elongated ribs extending substantially parallel to each other and having substantially triangular cross-sectional configurations, the non-conductive coating on a leading edge portion of the plurality of ribs being thinner than a portion of the sheet spaced apart from the plurality of ribs.

3. The apparatus of claim 2, wherein the plurality of ribs laterally extend substantially orthogonal to and intersect a first edge of the sheet.

4. The apparatus of claim 3, wherein the plurality of ribs have a pitch ranging from about 0.25 to 2 mm.

5. The apparatus of claim 2, wherein the plurality of ribs laterally extend at an angle relative to a first edge of the sheet.

6. The apparatus of claim 1, further comprising a corrosion-resistant coating between a surface of the sheet and the non-conductive coating.

7. The apparatus of claim 6, wherein the corrosion-resistant coating comprises a trivalent chromium ($Cr_3$) material.

8. The apparatus of claim 1, wherein the gasket further comprises a substantially non-conductive and substantially flexible substrate that is covered by an electrically conductive material.

9. The apparatus of claim 1, wherein the at least one protrusion comprises a plurality of elongated ribs that laterally extend along the chassis in a direction that is parallel to a direction of insertion of the bulkhead relative to the housing.

10. The apparatus of claim 1, wherein the sheet further comprises at least one substantially 90 degree arcuate bend, the at least one protrusion comprising at least one elongated rib that intersects the bend.

11. The apparatus of claim 10, wherein the sheet further comprises two substantially 90 degree arcuate bends to create a substantially C-shaped profile, the at least one protrusion comprising a plurality of elongated ribs formed along a flanged edge of the sheet adjacent to and intersecting one of the bends.

12. A joint comprising:
a chassis comprising a conductive sheet that includes a non-conductive coating, wherein the conductive sheet is deformed to provide a plurality of protrusions, the coating being thinner on a leading edge portion of the plurality of protrusions than a portion of the conductive sheet spaced apart from the plurality of protrusions;
a bulkhead; and
a flexible gasket having a conductive surface disposed on the bulkhead, the gasket being affixed to a surface of the bulkhead, such that upon engagement between the gasket and the plurality of protrusions, an electrically conductive path is provided between the chassis and the bulkhead through at least some of the plurality of protrusions and the gasket, wherein a computer housing comprises the joint and the bulkhead is dimensioned and configured to be removeably inserted into the housing adjacent the chassis to complete the electrically conductive path by the engagement between the engagement between the gasket and the plurality of protrusions, and thereby forming at least a portion of a Faraday cage.

13. The joint of claim 12, wherein the gasket comprises a substantially non-conductive flexible substrate that is covered by an electrically conductive layer, the gasket being secured to the bulkhead by a conductive adhesive.

14. The joint of claim 12, further comprising a corrosion-resistant coating between a surface of the conductive sheet and the non-conductive coating.

* * * * *

UNITED STATES PATENT AND TRADEMARK OFFICE
CERTIFICATE OF CORRECTION

PATENT NO. : 7,697,305 B2  Page 1 of 1
APPLICATION NO. : 11/741256
DATED : April 13, 2010
INVENTOR(S) : Gregory S. Meyer et al.

It is certified that error appears in the above-identified patent and that said Letters Patent is hereby corrected as shown below:

In column 2, line 3, after "substantially" insert -- orthogonal --.

In column 5, line 15, in Claim 4 delete "0.25 to 2 mm." and insert -- 0.25 mm to about 2 mm. --, therefor.

Signed and Sealed this

Fifth Day of October, 2010

David J. Kappos
*Director of the United States Patent and Trademark Office*